United States Patent
Jaeger et al.

(10) Patent No.: US 7,525,083 B2
(45) Date of Patent: Apr. 28, 2009

(54) RADIATION DETECTOR WITH AN EPITAXIALLY GROWN SEMICONDUCTOR BODY

(75) Inventors: Arndt Jaeger, Regensburg (DE); Peter Stauβ, Pettendorf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 11/240,987

(22) Filed: Sep. 29, 2005

(65) Prior Publication Data

US 2007/0241260 A1    Oct. 18, 2007

(30) Foreign Application Priority Data

Sep. 30, 2004  (DE)  ........................ 10 2004 047 645
Jan. 11, 2005  (DE)  ........................ 10 2005 001 280

(51) Int. Cl.
    *H01J 40/14*    (2006.01)
    *H01L 27/00*    (2006.01)
(52) U.S. Cl. ...................... 250/226; 250/208.1; 250/239
(58) Field of Classification Search ................ 250/226, 250/214.1, 339.01, 208.1, 338.4, 339.05; 257/440, 431
See application file for complete search history.

(56) References Cited

U.S. PATENT DOCUMENTS

| | | | | |
|---|---|---|---|---|
| 4,677,289 A | * | 6/1987 | Nozaki et al. | ................ 250/226 |
| 5,671,914 A | * | 9/1997 | Kalkhoran et al. | ............ 257/77 |
| 6,407,439 B1 | | 6/2002 | Hier et al. | |
| 6,660,928 B1 | * | 12/2003 | Patton et al. | ................. 136/249 |
| 6,875,975 B2 | * | 4/2005 | Faska et al. | ............... 250/214.1 |
| 2002/0058353 A1 | * | 5/2002 | Merrill | ........................ 438/57 |
| 2004/0178465 A1 | * | 9/2004 | Merrill et al. | ................ 257/440 |

FOREIGN PATENT DOCUMENTS

| GB | 2 228 824 | * | 9/1990 |
|---|---|---|---|
| GB | 2 228 824 A | | 9/1990 |

OTHER PUBLICATIONS

Preliminary Data Sheet MTCSiCT, Laser Components GmbH.
A. Liew, "Multi-olour Infra-red Focal Plane Arrays", Electronics Review, Chartered Electro-Optics Pte. Ltd., vol. 16, No. 3, pp. 18-19.

* cited by examiner

*Primary Examiner*—Que T Le
*Assistant Examiner*—Pascal M Bui-Pho
(74) *Attorney, Agent, or Firm*—Cohen Pontani Lieberman & Pavane LLP (57) ABSTRACT

A radiation detector comprising a plurality of detector elements (1, 2, 3) each having an active region (14, 24, 34) provided for radiation reception and for signal generation, the detector elements being monolithically integrated into a semiconductor body (5) of the radiation detector, a signal that is to be generated in a first detector element being able to be tapped off separately from a signal that is to be generated in a second detector element, and at least one of the active regions being designed for radiation reception in the visible spectral range.

27 Claims, 3 Drawing Sheets

RADIATION DETECTOR WITH AN EPITAXIALLY GROWN SEMICONDUCTOR BODY

RELATED APPLICATIONS

This patent application claims the priority of the German patent applications 10 2004 047 645.4 of Sep. 30, 2005 and 10 2005 001 280.9 of Jan. 11, 2005, the entire disclosure content of which is hereby explicitly incorporated by reference in the patent application.

FIELD OF THE INVENTION

The invention relates to a radiation detector comprising a plurality of detector elements (1, 2, 3) each having an active region (14, 24, 34) provided for radiation reception and for signal generation.

BACKGROUND OF THE INVENTION

A radiation detector comprising a plurality of Si photodiodes chips arranged next to one another is often used for radiation detection in different wavelength ranges. By means of external filters assigned to the individual Si photodiode chips, the spectral sensitivity distribution of the respective Si photodiode chip is adapted to the desired wavelength range. On account of the plurality of photodiode chips, such radiation detectors generally have a high space requirement. Such a radiation detector comprising a plurality of Si photodiode elements which are arranged spaced apart next to one another and whose respective sensitivity is adapted to different wavelength ranges by means of dielectric filters is known from the provisional data sheet regarding the component "MTCSiCT" from the company Laser Components. However, the component is comparatively cost-intensive on account of the complicated dielectric filtering.

A radiation detector of the generic type based on the III-V semiconductor material system $Al_xGa_{1-x}As$ comprising three detector elements arranged one above the other for three separate wavelength ranges, from 7 µm to 8 µm, from 10.5 µm to 11.5 µm and from 14 µm to 15 µm, in the far infrared, is disclosed in "Electronics Review, Volume 16, No. 3, pp. 18-19".

SUMMARY OF THE INVENTION

It is an object of the present invention to provide an efficient, compact radiation detector for detection in the visible spectral range which has a small space requirement and can be produced in a simplified and cost-effective manner.

This and other objects are attained in accordance with one aspect of the present invention directed to a radiation detector having a plurality of detector elements each having an active region provided for radiation reception and for signal generation. The detector elements are monolithically integrated into a semiconductor body of the radiation detector and the semiconductor body has a radiation entry side. A signal generated in a first detector element can be tapped off separately from a signal generated in a second detector element, the first detector element is partly transmissive to visible radiation, and visible radiation that passes through the first detector element generates a signal in the second detector element.

Monolithic integration of a plurality of detector elements into a semiconductor body facilitates an advantageously cost-effective production with the radiation detector at the same time being designed in a space-saving manner. The semiconductor body is preferably grown epitaxially on an epitaxial substrate. The detector elements are furthermore preferably arranged vertically with respect to a lateral main direction of extent of the semiconductor body one above the other in the semiconductor body.

Furthermore, on account of the plurality of detector elements which are monolithically integrated in the semiconductor body and whose signals can be tapped off independently of one another, the radiation detector is advantageously suitable for radiation detection in different wavelength ranges, in particular in the visible spectral range. A plurality of Si photodiode chips, as in conventional radiation detectors, can be dispensed with for this purpose. A detector element may, in particular, also be operated as an individual detector.

Furthermore, a detector element, preferably each of the detector elements, is assigned an, in particular continuous, wavelength range in which said detector element is sensitive, that is to say generates a significant signal. Particularly preferably, different detector elements are assigned different wavelength ranges.

In one preferred refinement of the invention, at least one detector element has an, in particular continuous, spectral sensitivity distribution with a maximum—a local or global maximum—at a predetermined maximum wavelength, which expediently lies in the wavelength range assigned to the detector element. Preferably, the maximum wavelengths of the spectral sensitivity distributions of at least two, particularly preferably all, detector elements are different.

In this case, what is critical for the spectral sensitivity distribution of a detector element is the dependence of the signal (photocurrent or quantities derived therefrom) generated in the active region of said detector element on the wavelength of the radiation incident on the detector element.

Radiation entering the semiconductor body from the radiation entry side impinges on a detector element. If the incident radiation contains a spectral component, in particular in the visible spectral range, for which the detector element is sensitive, then a corresponding proportion of the radiation power is absorbed in the active region of the detector element. The electron-hole pairs that are consequently generated in the active region contribute to the signal of the detector element. The proportion of radiation power absorbed in the active region can be influenced in a targeted manner by means of the thickness, and the sensitivity range of the detector element can be influenced in a targeted manner by means of the band gap of a functional layer arranged in the active region. The band gap of the functional layer expediently corresponds to the predetermined maximum wavelength of the spectral sensitivity distribution of the detector element. Enlarging the thickness of the functional layer generally results in an increase in the radiation power absorbed therein, which in turn generally supplies higher signals.

That proportion of the incident radiation which is transmitted through the detector element may generate a signal in one or more further detector element(s) arranged downstream of the above detector element as seen from the radiation entry side. By means of a targeted coordination of the thicknesses of the active regions or of the functional layers of the detector elements with one another, the values of the maxima, in particular of the global maxima, of the spectral sensitivity distributions of different detector elements can be adapted to one another. This facilitates the comparison of the signals generated in the different detector elements.

If different detector elements are assigned to different wavelength ranges or maximum wavelengths, then information about spectral components, in particular in the visible spectral range, in a radiation incident on the radiation detector can be obtained, in an advantageously simple manner, by means of the separately measurable signals generated in the respective detector element.

In order to facilitate an assignment of the signals to the active region of the respective detector element in which they were generated, the active regions in the semiconductor body of detector elements arranged adjacent are preferably spaced apart from one another. Particularly preferably, a low-signal region is formed between two adjacent active regions, in which low-signal region electron-hole pairs possibly generated by radiation absorption essentially recombine immediately and do not contribute, or contribute only to a very small extent, to the signal to be measured. Preferably, essentially only electron-hole pairs generated in the active region of a detector element contribute to the signal of said detector element.

A detector of the type mentioned in the introduction that is designed for the far infrared spectral range is unsuitable for the visible spectral range, even apart from the low sensitivity, since visible spectral components incident on it are essentially completely absorbed in the infrared detector element arranged at the radiation entry side and, accordingly, no appreciable signal would be generated in further detector elements arranged downstream of said detector element.

In a further preferred refinement of the invention, the radiation detector is designed for detecting radiation in a predetermined, preferably continuous, wavelength range. Particularly preferably, the maximum wavelengths of the detector elements of the radiation detector lie in this predetermined wavelength range, a significant signal being generated in particular also at an arbitrary wavelength in the range between two adjacent maximum wavelengths.

In a further preferred refinement of the invention, the spectral sensitivity distributions of at least two detector elements overlap. The coverage of a wide, continuous wavelength range by means of a plurality of detector elements is thus facilitated. In this case, a wide wavelength range may be regarded as a wavelength range which has at least a width that is greater than the sum of the spectral widths (FWHM: Full Width at Half Maximum) of the sensitivity distributions of the detector elements provided for covering the wavelength range.

It should be noted that overlap is understood to mean an overlap that stands out from a possible background noise. In particular, an overlap of two sensitivity distributions on account of edges trailing off asymptotically is not regarded as an overlap in the above sense.

In one advantageous development of the invention, sensitivity distributions with adjacent maximum wavelengths, preferably only with the nearest maximum wavelengths on both sides, overlap in pairs. The wavelength range covered by the radiation detector can thus advantageously be increased. In particular, an unnecessary common overlap of three sensitivity distributions can be avoided.

In a further preferred refinement of the invention, the maximum wavelengths of the spectral sensitivity distributions of the detector elements increase with increasing distance between the detector elements and the radiation entry side. A detector element arranged on the part of the radiation entry side thus preferably has a shorter-wave maximum wavelength, whereas a detector element arranged downstream of said detector element has a longer-wave maximum wavelength. Higher-energy short-wave radiation is thus more likely to be absorbed closer to the radiation entry side and generates a signal in a detector element arranged near the radiation entry side. The possibly undesirable influence of absorption of short-wave radiation components on the signals of the detector elements which are designed for longer-wave radiation and are arranged downstream of the detector element designed for shorter-wave radiation as seen from the radiation entry side can thus be reduced.

In a further preferred refinement of the invention, at least one active region has, preferably all active regions have, a single quantum well structure or a multiple quantum well structure or a heterostructure, in particular a double heterostructure. All active regions are preferably formed by means of a structure of identical type. Such structures are distinguished by advantageously high internal quantum efficiencies.

In the context of the application, the designation quantum well structure encompasses any structure in which charge carriers experience a quantization of their energy states as a result of confinement. In particular, the designation quantum well structure does not comprise any indication about the dimensionality of the quantization. It thus encompasses, inter alia, quantum wells, quantum wires and quantum dots and any combination of these structures.

In a further preferred refinement of the invention, the detector elements are in each case assigned a contact layer and a counter-contact layer, by means of which a signal generated in the active region of the detector element can be detected. In this case, a plurality of contact and/or counter-contact layers may be monolithically integrated in the semiconductor body.

Furthermore, the contact layer and/or the counter-contact layer of at least one detector element may be arranged between the detector element and a detector element adjacent thereto. A contact layer and a counter-contact layer, if they contain a semiconductor material, furthermore preferably have different conduction types (n- or p-conducting).

In a further preferred refinement of the invention, preferably in each case, two adjacent detector elements have a common contact layer or a common counter-contact layer, so that it is advantageously possible to dispense with the formation of separate contact layers or counter-contact layers for these detector elements. Furthermore, the space requirement of such a detector advantageously decreases on account of the reduced number of layers.

In an alternative refinement of the invention, a contact layer pair—formed by contact layer and counter-contact layer—of a detector element differs from that of an, in particular arbitrary, further detector element. The contact or counter-contact layer may thus be designed in a suitable manner for the respective detector element, depending on advantageous contact properties. In particular, it is possible to provide separate contact layer pairs for different detector elements.

In a further preferred refinement of the invention, a filter layer structure with at least one filter layer is arranged downstream of a detector element in the direction of the radiation entry side of the semiconductor body. Preferably, the filter layer structure is monolithically integrated into the semiconductor body.

The filter layer structure is furthermore preferably designed for absorbing wavelengths in a wavelength range comprising wavelengths less than the maximum wavelength of the spectral sensitivity distribution of the detector element. The radiation power absorbed in the filter layer structure is determined by a thickness, and the corresponding wavelength range of the absorption is determined by a—direct or indirect—band gap of the filter layer. The band gap of the filter layer is preferably larger than the band gap of the functional layer of the active region of the detector element. If appropriate, the filter layer structure may comprise a plurality of filter layers having different band gaps and/or thicknesses. By means of the filter layer structure, the short-wave side of the spectral sensitivity distribution, with wavelengths less than the maximum wavelength, can be shaped in a targeted manner since radiation components are absorbed in the filter layer and only a correspondingly reduced signal is generated in the active region of the detector element for wavelengths in the absorption range of the filter layer structure.

In one advantageous development of the invention, an, in particular separate filter layer structure of the type mentioned above is in each case assigned to a plurality of detector elements, preferably all the detector elements. Filter layer structures for the respective detector elements are different from one another, if appropriate. As a result of this, the short-wave sides of the sensitivity distributions of the detector elements can be adapted to one another with regard to their spectral profile, thereby facilitating the comparison of signals generated in different detector elements. The filter layer structure assigned to a detector element is furthermore preferably arranged between the detector element and a further, in particular adjacent, detector element arranged downstream thereof on the radiation entry side.

In one advantageous development of the invention, the contact layer or the counter-contact layer of at least one detector element is simultaneously designed as a filter layer, in particular as a filter layer of a filter layer structure assigned to this detector element.

In a further advantageous development of the invention, the filter layer structure assigned to a detector element absorbs in a wavelength range comprising wavelengths greater than the maximum wavelength of a further detector element. Preferably the further detector element is arranged downstream of the detector element on the radiation entry side in the semiconductor body and/or has a shorter-wave maximum wavelength compared with the maximum wavelength of the detector element. An oversized overlap of spectral sensitivity distributions of the two detector elements can thus be reduced in a simple manner, if appropriate.

In particular, it is advantageously possible to dispense with space-grabbing and complicated external filters, filters which are arranged outside the semiconductor body, for adapting the sensitivity of the radiation detector. Rather, the individual detector elements can be produced with a monolithically integrated filter layer structure in accordance with a predetermined sensitivity distribution.

In a further preferred refinement of the invention, the semiconductor body, in particular the active region and/or the filter layer structure of at least one detector element, contains at least one III-V semiconductor material, in particular a semiconductor material from the material systems $In_xGa_yAl_{1-x-y}P$, $In_xGa_yAl_{1-x-y}As$ or $In_xGa_yAl_{1-x-y}N$, in each case where $0 \leq x \leq 1$, $0 \leq y \leq 1$ and $x+y \leq 1$. Particularly preferably, the entire semiconductor body is based on III-V semiconductor materials. Such materials are distinguished by high internal quantum efficiencies.

In a further preferred refinement of the invention, the radiation detector is designed for the visible spectral range. Preferably, in this case a plurality, particularly preferably all, of the active regions are provided for radiation reception in the visible spectral range. It has been found that a radiation detector for the visible spectral range can be realized particularly efficiently by means of three detector elements. The active regions are preferably based on the material system $In_xGa_yAl_{1-x-y}P$, which is distinguished by high internal quantum efficiencies in the visible spectral range. Filter layer structures of the respective detector elements may be based on the material system $In_xGa_yAl_{1-x-y}P$ or $In_xGa_yAl_{1-x-y}As$. If the semiconductor body, in particular a filter layer structure, contains a material from the submaterial system $Al_xGa_{1-x}As$, then it is advantageous for reasons of lattice matching for the production of the semiconductor body to choose materials from the submaterial system $In_{0.5}(Ga_{1-x}Al_x)_{0.5}P$ for the layers based on the material system $In_xGa_yAl_{1-x-y}P$. In this case, the band gap can be set by way of the Al content.

Overall, it is possible to realize a radiation detector that covers a continuous wavelength range having a length of 280 nm, for instance from 400 nm to 680 nm. Particularly preferably, the radiation detector covers a continuous wavelength range from 430 to 650 nm.

In a further preferred refinement of the invention, the detector elements, in particular in each case, are designed for detecting varicolored radiations. By way of example, the radiation detector comprises three detector elements which are designed for detecting radiation in the blue, green and red spectral range, respectively.

In one advantageous development of the invention, the radiation detector is designed for determining spectral color components in the radiation to be received by the radiation detector. Information about the spectral color components in the radiation incident on the radiation detector can be obtained by tapping off the signals at the different detector elements, which are preferably assigned to different colors.

In a further preferred refinement of the invention, the radiation detector is designed for determining the color impression, for instance the color locus and/or the color temperature, of the incident radiation. The color locus is usually specified by the color coordinates (x and y) in the CIE diagram. If the incident radiation contains blue components to an increased extent, by way of example, then a correspondingly high signal is generated in the assigned detector element, or correspondingly low signals are generated in the detector elements for the red and green spectral ranges. Information about the color locus of the incident radiation can accordingly be obtained through comparison of the three independent signals.

DETAILED DESCRIPTION OF THE DRAWINGS

Elements that are identical, of identical type and act identically are provided with the same reference symbols in the figures.

Figure 1:
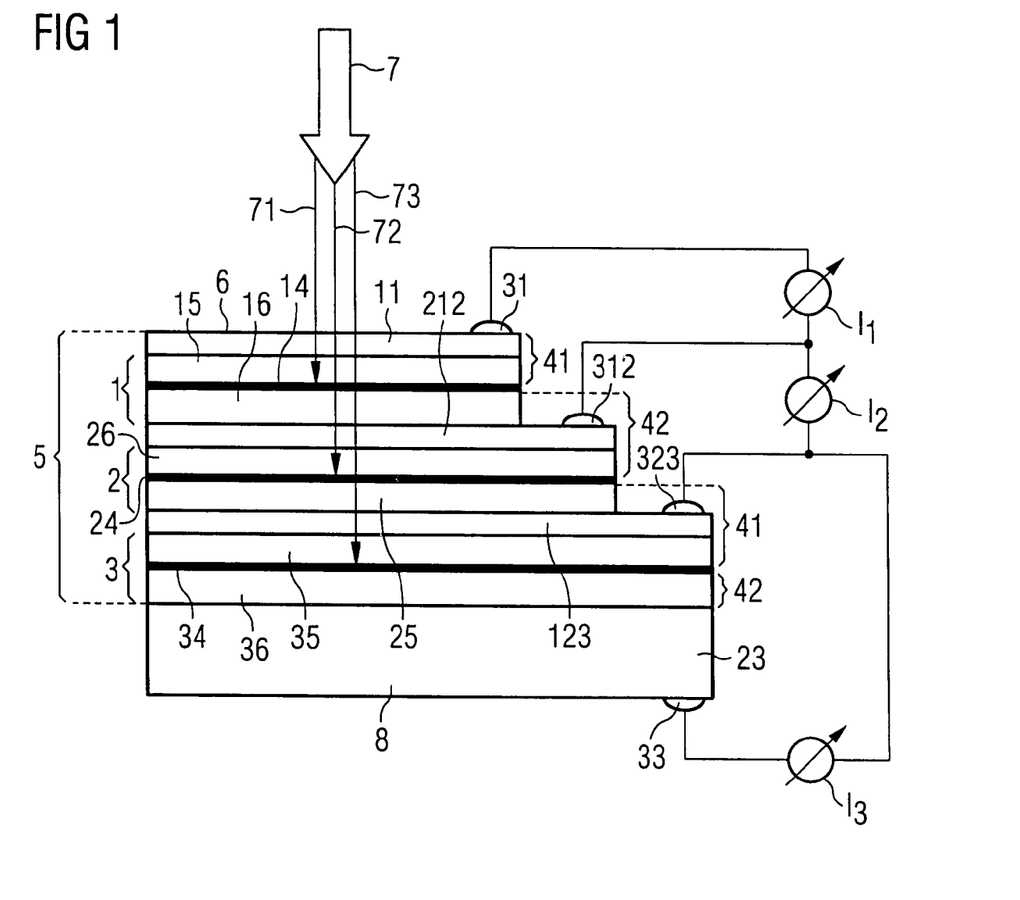
FIG. 1 shows a first exemplary embodiment of a radiation detector according to the invention on the basis of a schematic sectional view.

FIG. 1 schematically illustrates an exemplary embodiment of a radiation detector according to the invention on the basis of a sectional view.

In this exemplary embodiment, the radiation detector has a first detector element 1 with a first active region 14, a second detector element 2 with a second active region 24 and a third detector element 3 with a third active region 34, which are in each case provided for radiation reception and for signal generation and are monolithically integrated into a common semiconductor body 5. By way of example, the semiconductor body is for this purpose grown epitaxially on a suitable epitaxial substrate. The detector elements are arranged vertically one above the other with respect to a lateral main direction of extent of the active regions. The first detector element 1 is partly transmissive to visible radiation, so that visible radiation that passes through the first detector element generates a signal in the second or third detector element.

Radiation 7 impinging on the semiconductor body 5 from a radiation entry side 6 is partly absorbed in the active region 14 of the first detector element 1 in accordance with a band gap of a functional layer of the active region if the incident radiation has spectral components in the region of the band gap of the functional layer. Components from the radiation transmitted through the first detector element are accordingly absorbed in the second 2 and/or third 3 detector element. The electron-hole pairs generated by the absorption in the active regions that are spaced apart from one another supply signals which can be tapped off and detected simultaneously and separately from one another at different detector elements.

The active regions 14, 24 and 34 of the detector elements are preferably in each case arranged between a barrier layer 15, 25 and 35, respectively, and a counter-barrier layer 16, 26 and 36, respectively which preferably have identical compositions for different detector elements. Barrier and counter-barrier layers of a detector element furthermore preferably have different conduction types (n-conducting or p-conducting) and in each case bring about a space charge zone of the detector element, in which the active region of the detector element is arranged. Preferably, essentially only electron-hole pairs generated in the space charge zone of a detector element contribute to the signal of this detector element.

The semiconductor body 5 is arranged on a carrier 8, which mechanically stabilizes the semiconductor body. The carrier may comprise the epitaxial substrate of the semiconductor body 5 or be different from this. If the carrier is different from the epitaxial substrate, the semiconductor body is expediently fixed on the carrier after the epitaxy has ended, on the side remote from the epitaxial substrate. The epitaxial substrate may subsequently be removed. If appropriate, onto that side of the semiconductor body which is remote from the epitaxial substrate, prior to the arrangement on the carrier, a, for example metal-containing, mirror layer may also be applied to the carrier. In contrast to an epitaxial substrate, which has to satisfy high requirements, for instance with regard to the crystal structure, a carrier of this type may be chosen comparatively freely.

A radiation detector of this type can be produced cost-effectively and in a simple manner and has an advantageously small space requirement.

The detector elements can be operated in particular as mutually independent individual detectors which are expediently designed for detecting radiation in different wavelength ranges. The detector elements are integrated one above the other in a semiconductor chip (semiconductor body on the carrier).

For the purpose of making electrical contact with the radiation detector, each of the detector elements is assigned a contact layer and a counter-contact layer, by means of which the signal generated in the detector element can be detected separately from the rest of the detector elements. The contact and/or counter-contact layer is (are) preferably monolithically integrated in the semiconductor body. Furthermore, contact and counter-contact layer preferably have different conduction types.

In the exemplary embodiment in accordance with FIG. 1, the first detector element 1 is assigned a first contact layer 11 and a first counter-contact layer 212, which are monolithically integrated in the semiconductor body and between which the detector element 1 is arranged.

The first counter-contact layer 212 is advantageously simultaneously designed as a counter-contact layer for the second detector element 2, which is arranged between the first counter-contact layer 212 and the second contact layer 123, which is likewise monolithically integrated in the semiconductor body. The third detector element 3 is arranged between the second contact layer 123 and a second counter-contact layer 23. The second counter-contact layer 23 is expediently provided by the carrier 8. The adjacent detector elements 1 and 2, and respectively two and three, accordingly have a common counter-contact layer 212 and a common contact layer 123, respectively.

In order to form common (counter-)contact layers, it is expedient for the conduction types in the semiconductor body to change in the vertical direction at an active region and/or to be identical between two adjacent active regions. Preferably, semiconductor regions 41 are of the first conduction type and semiconductor regions 42 are of the second conduction type. If the carrier 8 serves for making contact with the radiation detector and contains a semiconductor material, then it is expediently doped in accordance with the conduction type of the adjoining semiconductor region.

By means of terminals 31, 312, 323 and 33, for example each containing a metal or an alloy, which are connected to the respective contact and counter-contact layers and are electrically conductively connected to the corresponding active regions via the contact layers and counter-contact layers, it is possible for the signal generated in the active regions to be detected and processed further.

A signal $l_1$ generated in the first active region 14 is detected by means of the terminals 31 and 312, a signal $l_2$ generated in the second active region 24 is detected by means of the terminals 312 and 323 and a signal $l_3$ generated in the third active region 34 is detected by means of the terminals 323 and 33.

The lateral extent of the detector elements, in particular of the active regions, preferably increases in the vertical direction as seen from the radiation entry side 6. The arrangement of the terminals on the corresponding contact and counter-contact layers is thus facilitated. By way of example, a course of this type may be realized by a staircase-like structure, as shown schematically in FIG. 1. Such structures may be produced from an unpatterned semiconductor basic body for example by means of wet-chemical etching or selective etching.

The detector elements may, if appropriate, also be provided with separate contact and counter-contact layers, in which case the height of the radiation detector would be correspondingly increased.

The detector elements 1, 2 and 3 of the radiation detector are preferably designed for detecting radiation in different wavelength ranges. The first detector element 1 is designed for instance for detecting radiation 71 in a first wavelength range, the second detector element 2 for detecting radiation 72 in a second wavelength range, and the third detector element for detecting radiation 73 in a third wavelength range.

The detector elements 1, 2 and 3 each have a spectral sensitivity distribution with a maximum at a maximum wavelength $\lambda_1$, $\lambda_2$ and $\lambda_3$, respectively. The detector elements are preferably arranged in such a way that the maximum wavelengths increase in the vertical direction, as seen from the radiation entry side 6, with increasing distance between the detector elements and the radiation entry side, that is to say $\lambda_1 < \lambda_2 < \lambda_3$. Consequently, the first detector element 1 on the radiation entry side is particularly sensitive to shorter-wave radiation, while the third detector element 3 furthest away from the radiation entry side is particularly sensitive to longer-wave radiation. The central second detector element 2 is particularly sensitive to wavelengths between $\lambda_1$ and $\lambda_3$.

Figure 2:
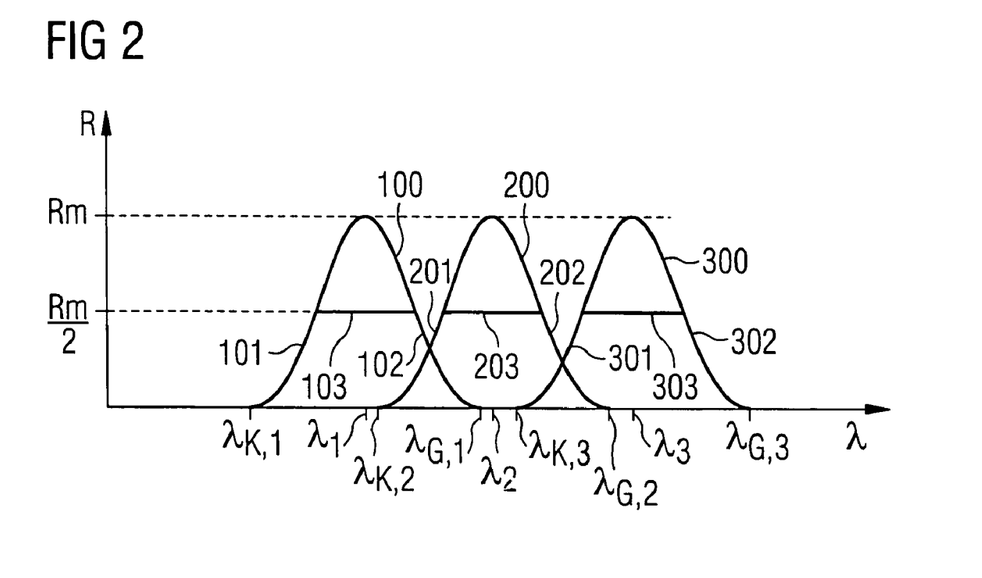
FIG. 2 shows a qualitative representation of the spectral sensitivity distribution of a radiation detector according to the invention in accordance with the first exemplary embodiment.

The sensitivity distribution of the radiation detector that is illustrated qualitatively in FIG. 2 results from the individual spectral sensitivity distributions of the detector elements 1, 2 and 3. FIG. 2 qualitatively illustrates the responsivity R (the photocurrent generated in the detector element relative to the radiation power incident on the radiation detector) of the detector elements 1, 2 and 3 as a function of the wavelength $\lambda$ of the incident radiation. The spectral sensitivity distributions 100 of the first detector element 1, 200 of the second detector element 2 and 300 of the third detector element 3 overlap in pairs in this case, so that the radiation detector is sensitive over a wide continuous wavelength range, a sensitivity distribution preferably only overlapping sensitivity distribution (s) with the closest maximum wavelength(s). The distributions 100 and 300 are preferably overlap-free.

The individual sensitivity distributions in each case have a short-wave limiting wavelength $\lambda_{K,i}$ and a long-wave limiting wavelength $\lambda_{G,i}$ (i=1, 2 and 3, respectively) which delimit the continuous sensitivity range of the corresponding detector element. In order that the continuous wide wavelength range that is covered by the radiation detector and extends from $\lambda_{K,1}$ to $\lambda_{G,3}$ is not narrowed unnecessarily, the detector elements are expediently coordinated with one another such that the overlap between two sensitivity distributions is comparatively small. By way of example, the detector elements are coordinated with one another in such a way that two overlapping sensitivity distributions intersect at a sensitivity value which is less than half the value of the maximum at the maximum wavelength, preferably less than both of the half maximum values, of the overlapping sensitivity distributions.

Furthermore, the detector elements are preferably coordinated with one another in such a way that, as shown in FIG. 2, they have essentially the same maximum values $R_M$ and/or essentially the same spectral widths (full width at half maximum) 103, 203 and 303, respectively. Furthermore, the differences between maximum wavelengths of different adjacent sensitivity distributions are preferably essentially the same. This makes it possible overall to obtain a uniform coverage of the sensitivity range of the radiation detector by means of the distributions of the individual detector elements. Moreover, the comparison of signals generated in different detector elements, for instance for determining spectral components in the radiation 7, is advantageously facilitated.

The maximum values of the spectral sensitivity distributions of the detector elements can be varied relative to one another by means of a suitable choice of the thicknesses of the active regions or of the functional layers in the active region. The thicker the active region, the higher, in general, the radiation proportion of the incident radiation that is absorbed in it, and the higher, in general, the resulting responsivity.

Preferably, a filter layer structure is arranged upstream of the detector elements in each case so that the filter layer structure is between the radiation entry side and the respective detector element. The filter layer structure comprises at least one filter layer and absorbing radiation in a continuous wavelength range comprising wavelengths less than the maximum wavelength of the detector element. The short-wave side of the spectral sensitivity distributions of the detector elements, provided with the reference symbols 101, 201 and 301, respectively, in FIG. 2, can be shaped in a targeted manner in this way. In particular, the spectral widths of the sensitivity distributions of the detector elements and/or the profiles of the short-wave sides can be matched to one another, thereby facilitating the comparison of signals generated in different detector elements with one another. The filter layer structures for the respective detector elements can particularly advantageously be monolithically integrated in the semiconductor body.

In one advantageous development of the invention, the contact or counter-contact layer of the respective detector element that is arranged in the radiation entry side is formed as a filter layer. A filter layer assigned to a detector element is furthermore preferably arranged between the active region of said detector element and a further detector element arranged downstream of the detector element on the radiation entry side.

Accordingly, the first contact layer 11 preferably absorbs, as filter layer for the first detector element 1, in the wavelength range less than $\lambda_1$, the first counter-contact layer 212, as filter layer for the second detector element 2, in the wavelength range less than $\lambda_2$, preferably between $\lambda_1$ and $\lambda_2$, and the second contact layer 123, as filter layer for the third detector element 3, in the wavelength range less than $\lambda_3$, preferably between $\lambda_2$ and $\lambda_3$.

In a further preferred refinement of the invention, the active region of at least one detector element, preferably of all the detector elements, comprises a functional region with a plurality of functional layers having different band gaps and/or thicknesses for signal generation.

By way of the configuration of the functional layers, the long-wave side of the spectral sensitivity distribution of the detector element can be shaped in a targeted manner for wavelengths greater than the maximum wavelength. For this purpose, the functional layers preferably absorb radiation in a, in particular continuous, wavelength range comprising wavelengths greater than the maximum wavelength of the detector element. In this case, the band gap of the respective functional layer determines the wavelength of the absorbed radiation and the thickness determines the absorbed radiation power. The functional layers may advantageously be formed in such a way that the signal generated in them behaves in accordance with a predetermined spectral sensitivity distribution. For wavelength ranges in which the spectral sensitivity distribution of the detector element is intended to assume comparatively high values in accordance with the predetermination, a functional layer is made comparatively thick and a comparatively high signal is generated in it in accordance with the absorbed radiation power. A further functional layer for low values of the spectral sensitivity distribution in accordance with the specification is made comparatively thin and only a correspondingly lower signal is generated in it.

The sensitivity distributions of the detector elements can be adapted to one another by means of such filter layer structures and/or functional regions. The comparison of signals generated in different detector elements can thus be facilitated. Through suitable formation of the functional region and/or of the filter layer structure, it is also possible, if appropriate, for the spectral widths of the individual sensitivity distributions to be advantageously adapted to one another.

Figure 3:
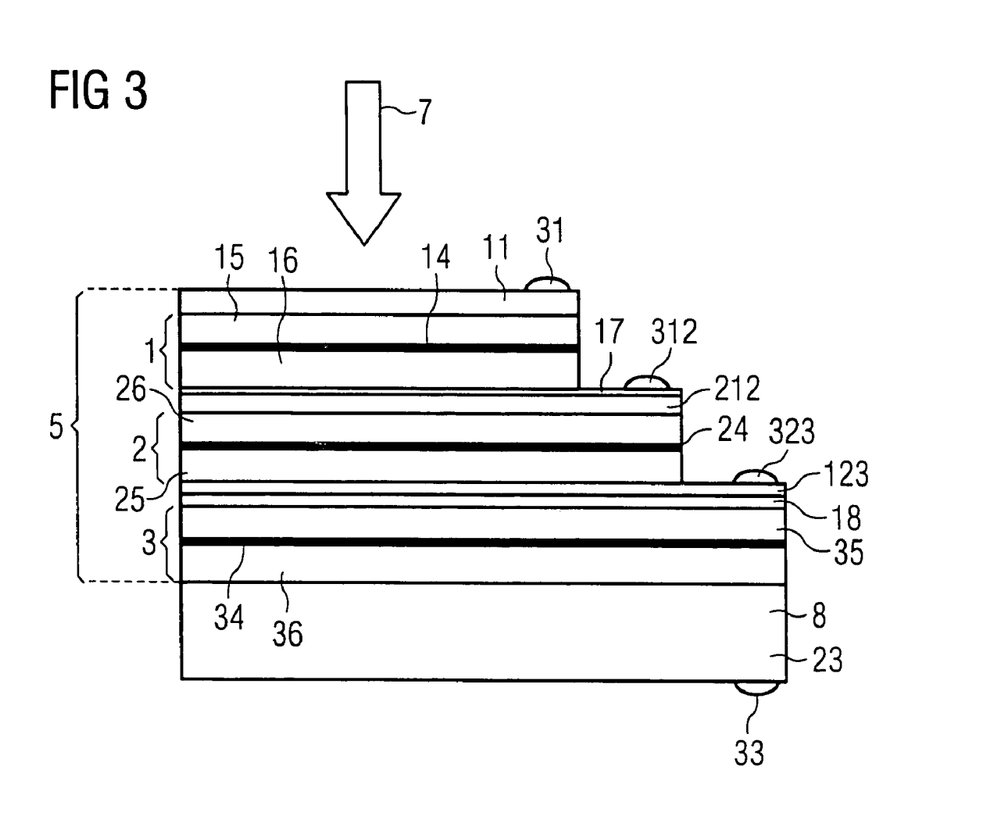
FIG. 3 shows a second exemplary embodiment of a radiation detector according to the invention on the basis of a schematic sectional view.

FIG. 3 schematically illustrates a further exemplary embodiment of a radiation detector according to the invention on the basis of a sectional view. The radiation detector in FIG. 3 essentially corresponds to that shown in FIG. 1. In contrast to FIG. 1, an etching stop layer 17 is arranged on that side of the first counter-contact layer 212 which faces the first detector element 1, and a filter layer 18 is arranged on the third detector element.

The etching stop layer 17 preferably serves as a barrier or marker during a, for instance wet-chemical, etching process by means of which the semiconductor body can be patterned from the side opposite to the carrier 8. If the semiconductor body is patterned by means of dry-chemical etching, such an etching stop layer may be dispensed with, if appropriate. Furthermore, an etching stop layer may also be arranged on the second contact layer 123 or the second contact layer may be formed as an etching stop layer which serves as a barrier for an etchant of identical type compared with the above etchant or an etchant that is different from the above etchant.

The filter layer 18 is preferably arranged on the side facing the second contact layer 123, between the second contact layer and the third detector element 3, and, in addition to the second contact layer 123 formed as a filter layer, absorbs wavelengths from the radiation transmitted through the second detector element and the second contact layer. The further contact layers 31 integrated in the semiconductor body and/or the counter-contact layer 212 are furthermore preferably likewise formed as a filter layer. The second contact layer is preferably distinguished by particularly advantageous contact properties with respect to the terminal 323 compared with the filter layer.

Figure 4:
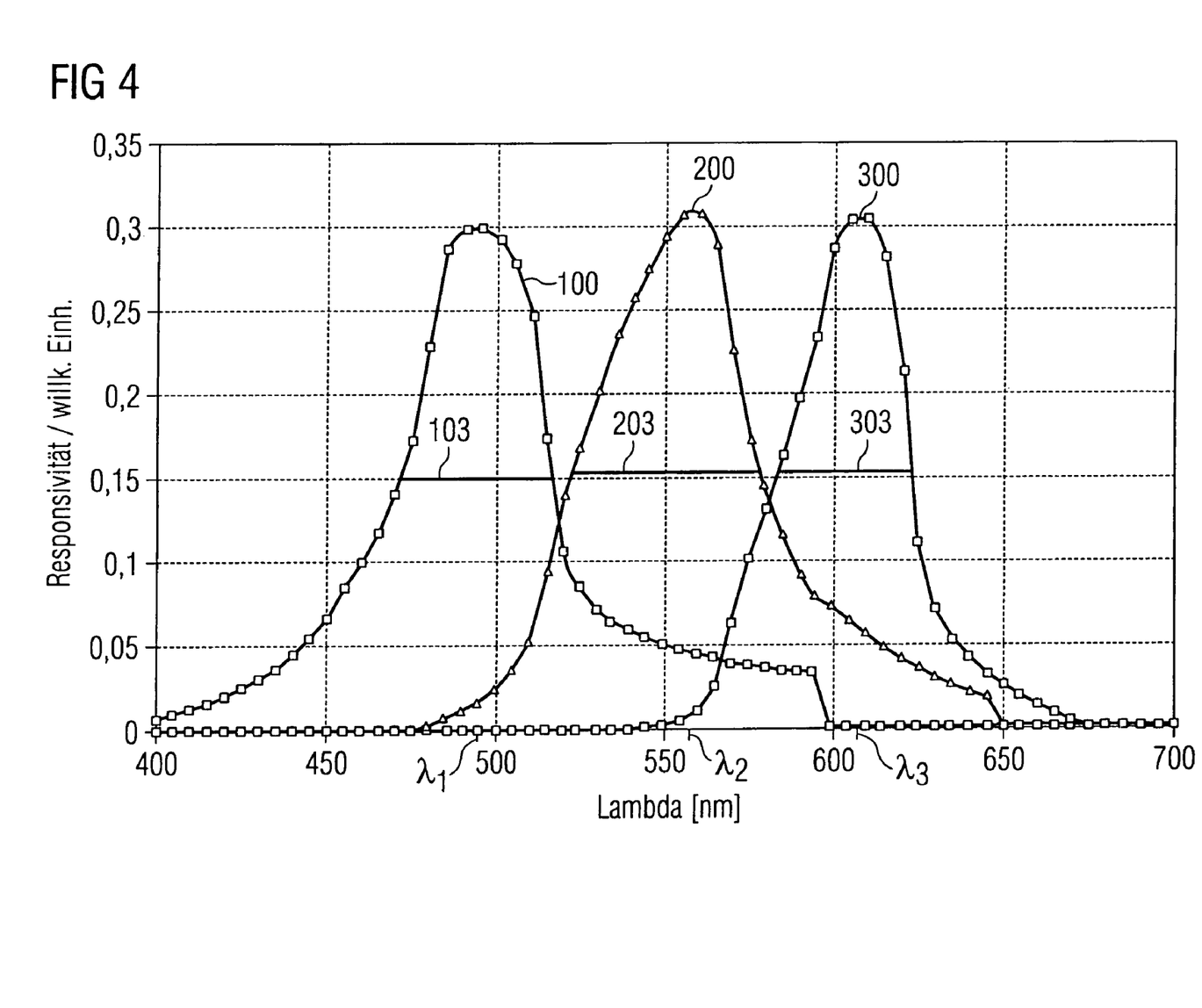
FIG. 4 shows a simulation of the spectral sensitivity distribution of the radiation detector in accordance with the second exemplary embodiment.

FIG. 4 quantitatively shows a simulation calculation of the wavelength dependence of the responsivity for a radiation detector in accordance with FIG. 3, designed for the visible spectral range and in particular for varicolored radiation.

The semiconductor body 5 of such a radiation detector in the visible spectral range is preferably based on the material systems $In_xGa_yAl_{1-x-y}P$ and $In_xGa_yAl_{1-x-y}As$, which are distinguished by good epitaxial properties and high quantum efficiencies achievable in a simplified manner in the visible spectral range. The semiconductor body is particularly preferably based on the material systems $In_{0.5}(Ga_{1-x}Al_x)_{0.5}P$ and $Al_xGa_{1-x}As$ which are distinguished by good lattice matching. Accordingly, high-quality layers made from these material systems can be grown epitaxially on one another in a simplified manner. The band gaps of functional layers in the active region which are preferably based on the material system $In_{0.5}(Ga_{1-x}Al_x)_{0.5}P$ can be set by way of the Al content.

In this case, the simulation was based on data corresponding to the following elements of the semiconductor body that were grown epitaxially one after the other, in the order corresponding to the table, on an n-conducting GaAs carrier 8 forming the epitaxial substrate. D designates the thickness, $E_G$ designates the critical band gap for absorption, and $\lambda_G$ designates the wavelength corresponding to said band gap.

The active regions 14, 24 and 34 are designed for the detection of varicolored radiations. The first active region 14 is designed for blue radiation, the second active region 24 for green radiation, and the third active region 34 for red radiation. The maximum wavelengths $\lambda_1 \approx 490$ nm, $\lambda_2 \approx 553$ nm and $\lambda_3 \approx 615$ nm of the sensitivity distributions 100, 200 and 300, respectively, of the detector elements that result from such a structure lie in the corresponding spectral ranges. On account of the capability of separately tapping off the signals at different detector elements, it is possible to determine spectral color components, and if appropriate the color locus or the color temperature, of the radiation 7 incident on the radiation detector.

The filter layer structure for shaping the short-wave side of the sensitivity distribution of the first detector element in this case comprises the first contact layer 11 and the barrier layer 15, which are embodied as filter layers having suitable band gaps and thicknesses. The filter layer structure of the second detector element comprises the first counter-contact layer 212 and the filter layer structure for the third detector element essentially comprises the filter layer 18. The second contact layer 123 is designed for efficiently forming electrical contact with respect to the second and third detector elements, and at the same time as an etching stop layer. The active regions 14, 24 and 34 each comprise an individual functional layer.

It should be noted that the short-wave side of the sensitivity distribution of an arbitrary detector element, if appropriate, is also influenced, and correspondingly shaped, by structures that are arranged downstream of said detector element on the radiation entry side and absorb wavelengths less than the maximum wavelengths of the detector element, for instance a further detector element and/or the filter layer structure assigned thereto. A filter layer structure that is directly arranged downstream of the arbitrary detector element on the radiation entry side preferably undertakes, however, a large part of the shaping of the short-wave side of the sensitivity distribution of this detector element.

The radiation detector is sensitive to wavelengths of approximately 400 nm to approximately 680 nm and thus covers essentially the entire visible spectral range, disregarding the far red components having wavelengths of between approximately 680 nm and 700 nm. The spectral widths 103, 203 and 303, respectively, of the sensitivity distributions lie between approximately 40 and approximately 50 nm.

|  | Material | D [nm] ≈ | $E_G$ [eV] ≈ | $\lambda_G$ [nm] ≈ | Conduction type/doping |
|---|---|---|---|---|---|
| Counter-barrier layer 36 | $In_{0.5}Al_{0.5}P$ | 500 | 2.52 | 492 | n-conducting |
| Third active region 34 | $In_{0.5}(Ga_{0.8}Al_{0.2})_{0.5}P$ | 1000 | 2.02 | 614 | Intrinsic |
| Barrier layer 35 | $In_{0.5}Al_{0.5}P$ | 300 | 2.52 | 492 | p-conducting |
| Filter layer 18 | $In_{0.5}(Ga_{0.6}Al_{0.4})_{0.5}P$ | 200 | 2.15 | 577 | p-conducting |
| Second contact layer 123 | $Al_{0.5}Ga_{0.5}As$ | 200 | 2.00 | 620 | p-conducting/e.g. $Al_{0.5}Ga_{0.5}As$:C |
| Barrier layer 25 | $In_{0.5}Al_{0.5}P$ | 300 | 2.52 | 492 | p-conducting |
| Second active region 24 | $In_{0.5}(Ga_{0.5}Al_{0.5})_{0.5}P$ | 1400 | 2.22 | 559 | intrinsic |
| Counter-barrier layer 26 | $In_{0.5}Al_{0.5}P$ | 300 | 2.52 | 492 | n-conducting |
| First counter-contact layer 212 | $In_{0.5}(Ga_{0.35}Al_{0.65})_{0.5}P$ | 150 | 2.31 | 538 | n-conducting/e.g. $In_{0.5}(Ga_{0.35}Al_{0.65})_{0.5}P$:Te |
| Etching stop layer 17 | $Al_{0.7}Ga_{0.3}As$ | 50 | 2.05 | 605 | n-conducting |
| Counter-barrier layer 16 | $In_{0.5}Al_{0.5}P$ | 300 | 2.52 | 492 | n-conducting |
| First active region 14 | $In_{0.5}(Ga_{0.2}Al_{0.8})_{0.5}P$ | 600 | 2.40 | 517 | Intrinsic |
| Barrier layer 15 | $In_{0.5}Al_{0.5}P$ | 300 | 2.52 | 492 | p-conducting |
| First contact layer 11 | GaP | 100 | 2.73 | 454 | p-conducting/e.g. GaP:Mg |

The common overlap—occurring in accordance with the simulation—of the three sensitivity distributions 100, 200 and 300 between approximately 550 and 600 nm may, if appropriate, by adaptation of the active region of the detector elements and/or of the respective filter layer structure(s), also be reduced or eliminated in such a way that an arbitrary predetermined sensitivity distribution only overlaps the sensitivity distribution(s) whose maximum wavelength(s) is(are) directly adjacent to that of the predetermined sensitivity distribution.

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

We claim:

1. A radiation detector comprising:
   an epitaxially grown semiconductor body comprising a III-V semiconductor material and having a radiation entry side; and
   a plurality of detector elements each having an active region provided for radiation reception and for signal generation, the plurality of detector elements being monolithically integrated into the semiconductor body, wherein a signal generated in a first detector element of the plurality of detector elements can be tapped off separately from a signal generated in a second detector element of the plurality of detector elements,
      each of the active regions of the first detector element and the second detector element is arranged between a barrier layer and a counter-barrier layer, and the barrier layer and the counter-barrier layer are of different conduction types,
      the first detector element and the second detector element are each assigned a contact layer and a counter-contact layer, and the contact layer and the counter-contact layer are monolithically integrated into the semiconductor body,
      at least one of the contact layer and the counter-contact layer is arranged between two adjacent ones of the plurality of detector elements, and the contact layer and the counter-contact layer are of different conduction types,
      the conduction types in the semiconductor body between two adjacent active regions, are identical,
      the first detector element is partly transmissive to visible radiation, and
      the visible radiation that passes through the first detector element generates a signal in the second detector element.

2. The radiation detector as claimed in claim 1, wherein the active regions in the semiconductor body of adjacent ones of the plurality of detector elements are spaced apart from one another.

3. The radiation detector as claimed in claim 1, wherein at least one of the plurality of detector elements has a spectral sensitivity distribution with a maximum at a predetermined maximum wavelength.

4. The radiation detector as claimed in claim 3, wherein the spectral sensitivity distributions of at least two of the plurality of detector elements have different maximum wavelengths.

5. The radiation detector as claimed in claim 3, wherein the spectral sensitivity distributions of at least two of the plurality of detector elements overlap.

6. The radiation detector as claimed in claim 3, wherein the maximum wavelengths of the spectral sensitivity distributions of the plural detector elements increase with increasing distance between the plurality of detector elements and the radiation entry side of the radiation to be received by the radiation detector into the semiconductor body.

7. The radiation detector as claimed in claim 1, wherein the radiation detector is designed for detecting radiation in a predetermined continuous wavelength range.

8. The radiation detector as claimed in claim 1, wherein at least one of the active regions has a single quantum well structure or a multiple quantum well structure or a heterostructure.

9. The radiation detector as claimed in claim 1, wherein a filter layer structure with at least one filter layer is arranged downstream of at least one of the plurality of detector elements in the direction of the radiation entry side of the semiconductor body.

10. The radiation detector as claimed in claim 9, wherein the filter layer structure is designed for absorbing wavelengths in a wavelength range comprising wavelengths less than the maximum wavelength of the spectral sensitivity distribution of said at least one of the plurality of detector elements.

11. The radiation detector as claimed in claim 9, wherein the contact layer or the counter-contact layer of at least one of the plurality of detector elements is simultaneously designed as a filter layer of a filter layer structure assigned to this detector element.

12. The radiation detector as claimed in claim 9, wherein the active region of the second detector element has a functional layer and at least one of the filter layers of the filter layer structure has a band gap which is larger than the band gap of the functional layer of the second detector element.

13. The radiation detector as claimed in claim 9, wherein the filter layer structure comprises at least one III-V semiconductor material.

14. The radiation detector as claimed in claim 1, wherein the III-V semiconductor material is a material from the material systems $In_xGa_yAl_{1-x-y}P$, $In_xGa_yAl_{1-x-y}As$ or $In_xGa_yAl_{1-x-y}N$ in each case where $0 \leq x \leq 1$, $0 \leq y \leq 1$ and $x+y \leq 1$.

15. The radiation detector as claimed in claim 1, wherein the plural detector elements are designed for detecting vari-colored radiations.

16. The radiation detector as claimed in claim 1, wherein the plurality of detector elements comprise three detector elements which are designed for detecting radiation in the blue, green and red spectral range, respectively.

17. The radiation detector as claimed in claim 1, wherein the radiation detector is designed for determining spectral color components in the radiation to be received by the radiation detector.

18. The radiation detector as claimed in claim 1, wherein the radiation detector is designed for determining the color impression of radiation incident on the detector.

19. The radiation detector as claimed in claim 1, wherein at least one of the active region and a filter layer structure of at least one of the plurality of detector elements comprises at least one III-V semiconductor material.

20. The radiation detector as claimed in claim 1, wherein each detector element is arranged between the assigned contact layer and the assigned counter-contact layer.

21. The radiation detector as claimed in claim 1, wherein the contact layers and the counter-contact layer are spaced apart from one another in the vertical direction.

22. The radiation detector as claimed in claim 1, wherein the entire semiconductor body is based on III-V semiconductor materials.

23. A radiation detector comprising:
an epitaxially grown semiconductor body having a radiation entry side; and
a plurality of detector elements each having an active region provided for radiation reception and for signal generation, the plurality of detector elements being monolithically integrated into the semiconductor body;
wherein:
the semiconductor body comprises a III-V semiconductor material,
the first and the second detector elements are each assigned a contact layer and a counter-contact layer and at least one of the contact layer and the counter-contact layer is arranged between two adjacent ones of the plurality of detector elements, the contact layers and the counter-contact layers being of different conduction types,
the lateral extent of the detector elements increases as the vertical direction from the radiation entry side increases,
terminals are arranged on and electrically conductively connected to the contact layers and the counter-contact layers such that a signal generated in a first detector element of the plurality of detector elements can be tapped off separately from a signal generated in a second detector element of the plurality of detector elements,
the first detector element is partly transmissive to visible radiation, and
visible radiation that passes through the first detector element generates a signal in the second detector element.

24. The radiation detector as claimed in claim 23, wherein the plurality of detector elements are in each case assigned a contact layer and a counter-contact layer and at least one of the contact layer and the counter-contact layer is arranged between two adjacent ones of the plurality of detector elements.

25. The radiation detector as claimed in claim 24, wherein two adjacent ones of the plurality of detector elements have a common contact layer or a common counter-contact layer.

26. The radiation detector as claimed in claim 23, wherein the contact layers and the counter-contact layers have different conduction types.

27. The radiation detector as claimed in claim 23, wherein the semiconductor body has a staircase-like structure.

* * * * *